(12) United States Patent
Chen et al.

(10) Patent No.: US 7,632,707 B2
(45) Date of Patent: Dec. 15, 2009

(54) ELECTRONIC DEVICE PACKAGE AND METHOD OF MANUFACTURING THE SAME

(75) Inventors: Shou-Lung Chen, Yangmei Township, Taoyuan County (TW); Ching-Wen Hsiao, Banciao (TW); Yu-Hua Chen, Mingjian Shiang (TW); Jeng-Dar Ko, Pade (TW); Jyh-Rong Lin, Tucheng (TW)

(73) Assignee: Industrial Technology Research Institute, Hsinchu (TW)

( * ) Notice: Subject to any disclaimer, the term of this patent is extended or adjusted under 35 U.S.C. 154(b) by 633 days.

(21) Appl. No.: 11/269,613

(22) Filed: Nov. 9, 2005

(65) Prior Publication Data

US 2006/0157864 A1    Jul. 20, 2006

(30) Foreign Application Priority Data

Jan. 12, 2005  (TW) ................................ 94100850 A

(51) Int. Cl.
  *H01L 21/00*  (2006.01)
(52) U.S. Cl. ............................. 438/106; 438/6; 438/15; 438/25; 438/26; 438/51; 438/55; 438/64; 438/68; 438/460; 438/118; 438/125; 438/700; 438/119; 438/774; 438/613; 438/387; 438/667; 257/686
(58) Field of Classification Search .................. 438/106
See application file for complete search history.

(56) References Cited

U.S. PATENT DOCUMENTS

| | | | | |
|---|---|---|---|---|
| 4,786,357 A | * | 11/1988 | Campanelli et al. ............ | 216/27 |
| 4,875,968 A | * | 10/1989 | O'Neill et al. ................. | 216/27 |
| 4,961,821 A | * | 10/1990 | Drake et al. ................... | 438/21 |
| 5,068,006 A | * | 11/1991 | Fisher ........................ | 216/27 |
| 5,229,785 A | * | 7/1993 | Leban ......................... | 347/47 |
| 5,308,442 A | * | 5/1994 | Taub et al. .................... | 216/27 |
| 5,387,314 A | * | 2/1995 | Baughman et al. ............. | 216/27 |
| 5,408,739 A | * | 4/1995 | Altavela et al. ................ | 29/611 |
| 5,557,844 A | * | 9/1996 | Bhatt et al. ................... | 29/852 |
| 5,581,861 A | * | 12/1996 | Lee et al. .................... | 29/25.35 |
| 5,828,394 A | * | 10/1998 | Khuri-Yakub et al. ......... | 347/72 |
| 5,870,289 A | * | 2/1999 | Tokuda et al. ................ | 361/779 |
| 5,890,745 A | * | 4/1999 | Kovacs ........................ | 285/24 |
| 6,013,948 A | * | 1/2000 | Akram et al. ................. | 257/698 |
| 6,039,439 A | * | 3/2000 | Komplin et al. ................ | 347/65 |
| 6,126,140 A | * | 10/2000 | Johnson et al. ........ | 251/129.01 |

(Continued)

*Primary Examiner*—Fernando L Toledo
*Assistant Examiner*—Ankush k Singal
(74) *Attorney, Agent, or Firm*—Bacon & Thomas, PLLC

(57) ABSTRACT

The present invention discloses an electronic device package and a method of the package. In particular, an electronic device package and a method of the package suitable for a bumpless electronic device package with enhanced electrical performance and heat-dissipation efficiency are disclosed. The method comprises: providing a substrate having a plurality of vias and a plurality of electronic devices; forming a gluing layer on a surface of the substrate and fixing the electronic devices on the gluing layer, wherein the electronic devices have I/O units aligned with the vias respectively; forming a plurality of fixing layers in the gaps between the electronic devices; trenching a plurality of openings aligned with the vias respectively in the fixing layer; forming a plurality of metallic conductive units in the vias, the openings and part of the surface of the substrate; and forming a passivation layer over the other surface of the substrate.

8 Claims, 13 Drawing Sheets

U.S. PATENT DOCUMENTS

| | | | |
|---|---|---|---|
| 6,127,198 A * | 10/2000 | Coleman et al. | 438/21 |
| 6,235,212 B1 * | 5/2001 | Silverbrook | 216/27 |
| 6,235,554 B1 | 5/2001 | Akram et al. | 438/109 |
| 6,242,321 B1 * | 6/2001 | Acosta et al. | 438/424 |
| 6,297,553 B1 * | 10/2001 | Horiuchi et al. | 257/737 |
| 6,365,974 B1 * | 4/2002 | Abbott et al. | 257/774 |
| 6,409,311 B1 * | 6/2002 | Gooray et al. | 347/54 |
| 6,449,831 B1 * | 9/2002 | Komplin et al. | 29/611 |
| 6,482,574 B1 * | 11/2002 | Ramaswami et al. | 430/320 |
| 6,482,730 B1 | 11/2002 | Masumoto et al. | 438/617 |
| 6,521,485 B2 * | 2/2003 | Su et al. | 438/114 |
| 6,521,530 B2 * | 2/2003 | Peters et al. | 438/667 |
| 6,540,337 B1 * | 4/2003 | Pollard | 347/65 |
| 6,555,906 B2 | 4/2003 | Towle et al. | 257/723 |
| 6,586,822 B1 | 7/2003 | Vu et al. | 257/678 |
| 6,586,836 B1 | 7/2003 | Ma et al. | 257/723 |
| 6,608,371 B2 * | 8/2003 | Kurashima et al. | 257/686 |
| 6,612,535 B1 * | 9/2003 | Tai et al. | 251/11 |
| 6,626,520 B1 * | 9/2003 | Hawkins et al. | 347/54 |
| 6,628,178 B2 * | 9/2003 | Uchikoba | 333/193 |
| 6,664,485 B2 * | 12/2003 | Bhatt et al. | 174/264 |
| 6,781,484 B2 * | 8/2004 | Matsuta | 333/193 |
| 6,784,765 B2 * | 8/2004 | Yamada et al. | 333/193 |
| 6,796,019 B2 * | 9/2004 | Komplin et al. | 29/611 |
| 6,820,328 B2 * | 11/2004 | Barcley | 29/832 |
| 6,833,613 B1 * | 12/2004 | Akram et al. | 257/686 |
| 6,863,382 B2 * | 3/2005 | Anagnostopoulos et al. | 347/70 |
| 6,873,529 B2 * | 3/2005 | Ikuta et al. | 361/719 |
| 6,874,867 B2 * | 4/2005 | DeBar et al. | 347/54 |
| 6,905,914 B1 * | 6/2005 | Huemoeller et al. | 438/118 |
| 6,915,566 B2 * | 7/2005 | Abbott et al. | 29/852 |
| 6,938,310 B2 * | 9/2005 | Hawkins et al. | 29/25.35 |
| 6,966,110 B2 * | 11/2005 | DeBar et al. | 29/890.1 |
| 6,966,112 B2 * | 11/2005 | Kawamura | 29/890.1 |
| 7,001,798 B2 * | 2/2006 | Yamaguchi | 438/114 |
| 7,011,392 B2 * | 3/2006 | Chen et al. | 347/48 |
| 7,018,015 B2 * | 3/2006 | Truninger et al. | 347/49 |
| 7,041,534 B2 * | 5/2006 | Chao et al. | 438/114 |
| 7,267,431 B2 * | 9/2007 | Anderson et al. | 347/65 |
| 7,279,402 B2 * | 10/2007 | Yamada | 438/460 |
| 7,350,406 B2 * | 4/2008 | Yabe et al. | 73/114.76 |
| 7,420,272 B1 * | 9/2008 | Huemoeller et al. | 257/700 |
| 7,438,030 B1 * | 10/2008 | Okojie | 123/90.11 |
| 2002/0017710 A1 * | 2/2002 | Kurashima et al. | 257/686 |
| 2002/0145647 A1 * | 10/2002 | Kataoka et al. | 347/65 |
| 2003/0017647 A1 | 1/2003 | Kwon et al. | 438/109 |
| 2004/0004281 A1 * | 1/2004 | Bai et al. | 257/706 |
| 2005/0241754 A1 * | 11/2005 | Iri et al. | 156/268 |
| 2005/0287708 A1 * | 12/2005 | Kim et al. | 438/118 |

* cited by examiner

PRIOR ART

ELECTRONIC DEVICE PACKAGE AND METHOD OF MANUFACTURING THE SAME

BACKGROUND OF THE INVENTION

1. Field of the Invention

The present invention relates to an electronic device package and a method of manufacturing the package, and more particularly, to an electronic device package and a method of manufacturing the package suitable for a bumpless electronic device package with enhanced electrical performance and heat-dissipation efficiency.

2. Description of Related Art

A prior electronic device packaging process is described as follows. At the beginning, as shown in FIG. 1a, a plurality of through-holes (not shown) is trenched in the substrate 11 by mechanical drilling or laser drilling, and the fixing tape 12 is then adhered to the surface of the substrate 11. Next, a quantity of dice 13 is placed into the plurality of through-holes, being held with the aforesaid fixing tape 12. Even so, the dice mounted with the fixing tape 12 are not held in a completely secure manner. Therefore, glue 14 is generally injected into the though-holes to further fix the position of the dice 13. After all, as shown in FIG. 1b, the passivation layer 15 made from a dielectric material is formed over a surface of the substrate opposing to the surface covered with the fixing tape 12 by spin coating or other manners.

It can be easily understood that the dice 13 need to be fully accommodated and fixed in the through-holes of the aforesaid substrate 11. Consequently, the size of each of the through-holes must be accurate and be slightly larger than that of the die. When a plurality of dice with different sizes is packaged on a single substrate, it will be necessary to have the through-holes with various widths and lengths each of which corresponding to the size of dice respectively. As such, the packaging process will become much complicated.

Besides, due to the size of the aforesaid through-hole are just slightly larger than that of the die 13 accommodated therein. The die 13 may get stuck obliquely somewhere within the through-hole so that the die 13 fails to be mounted on the fixing tape 12 disposed at the bottom of the through-hole as desired. The deviation of the position of the die will cause the subsequent process being unable to execute, such as formation of metal contacts. Thus, the yield of the electronic device packages is adversely affected. Furthermore, since the dice 13 are fully enclosed with the glue 14 in the through-holes, the heat generated during operation of the dice 13 cannot be efficiently dissipated to the external environment. Thus, the package tends to be overheated, shorten the lifetime of the dice 13.

Although the electrical performance of the electronic device package can be satisfactory, the yield of the electronic device package formed by the prior process is low. Therefore, a dire need exists for the industry to provide an improved method of electronic device packages capable of solving the disadvantages of the aforesaid prior electronic device packaging process, simplifying the process of electronic device packages and increasing the yield of such packages.

SUMMARY OF THE INVENTION

A manufacturing method of an electronic device package according to the present invention comprises: providing a substrate having a plurality of first vias and a plurality of electronic devices each of which having a plurality of I/O units; forming a gluing layer on a first surface of the substrate; fixing the electronic devices on the gluing layer, wherein the I/O units of the electronic devices are aligned with the first vias respectively; forming a plurality of fixing layers in the gaps between the electronic devices; trenching a plurality of first openings aligned with the first vias in the fixing layer respectively; forming a plurality of first metallic conductive units in the first vias, the first openings and part of a second surface of the substrate, wherein the first metallic conductive units are connected to the I/O units respectively; and forming a passivation layer over the second surface of the substrate, wherein the second surface is remote from the electronic devices.

A manufacturing method of an electronic device package according to the present invention comprises: providing a substrate having a first surface on which a gluing layer is formed and a plurality of electronic devices each of which having a plurality of I/O units; fixing the electronic devices on the gluing layer; forming a plurality of fixing layers in the gaps between the electronic devices; trenching a plurality of first vias in the substrate and a plurality of first openings in the gluing layer, wherein the first openings are aligned with the I/O units while the first vias are aligned with the first openings; forming a plurality of first metallic conductive units in the first vias, the first openings and part of a second surface of the substrate, wherein the first metallic conductive units are connected to the I/O units respectively; and forming a passivation layer over the second surface of the substrate, wherein the second surface is remote from the electronic devices.

An electronic device package associated with a plurality of electronic devices each of which having a plurality of I/O units according to the present invention comprises: a substrate having a plurality of first vias; a gluing layer having a plurality of first openings, wherein the electronic devices are fixed to a first surface of the substrate with the gluing layer, the first vias correspond to the first openings corresponding to the I/O units respectively; a plurality of fixing layers being disposed on the first surface of the substrate and in the gaps between the electronic devices; a plurality of metallic conductive units mounted in the first vias, the first openings and part of a second surface of the substrate, respectively, wherein the first metallic conductive units are connected to the I/O units respectively; a passivation layer covering part of a surface of the first metallic conductive units; and a plurality of conducting members formed on part of the surface of the first metallic conductive units which is not covered with the passivation layer.

Accordingly, the electronic device package and the manufacturing method of the package provided by the present invention can solve the disadvantages of the prior electronic device packaging process, simplify the process of electronic device packages and increase the yield of such packages.

The substrate of the present invention is not specifically defined, preferably glass fiber, polyimide, copper, aluminum or a non-conductive plastic material. The electronic devices of the present invention is not specifically defined, preferably a dice. The method for forming the first vias of the substrate of the present invention is not specifically defined, preferably by laser drilling or mechanical drilling. The method for forming the first openings of the present invention is not specifically defined, preferably by mechanical drilling or laser drilling.

The form of the gluing layer of the present invention is not specifically defined, preferably a liquid-state glue or a thin-film glue.

The method for forming the gluing layer of the present invention is not specifically defined, preferably by a sol-gel method, a bonding method, a printing method or a pressing method. The method for forming the fixing layers in the gaps between the electronic devices of the present invention is not specifically defined, preferably by a spin coating method, a sol-gel method or a screen printing method. The first metallic conductive units of the present invention can be made from any kind of conducting material, preferably copper or gold. The method for forming the passivation layer of the present invention is not specifically defined, preferably by a sol-gel method, a spin coating method or a screen printing method. The method for forming second vias of the present invention in the substrate is not specifically defined, preferably by laser drilling or mechanical drilling. The method for forming second openings of the present invention in the gluing layer is not specifically defined, preferably by mechanical drilling or laser drilling. The method for forming through-holes of the present invention in the fixing layers is not specifically defined, preferably by mechanical drilling or laser drilling. The second metallic conductive units of the present invention can be made from any kind of conducting material, preferably copper or gold.

Other objects, advantages, and novel features of the invention will become more apparent from the following detailed description when taken in conjunction with the accompanying drawings.

DETAILED DESCRIPTION OF THE PREFERRED EMBODIMENT

Figure 1A:
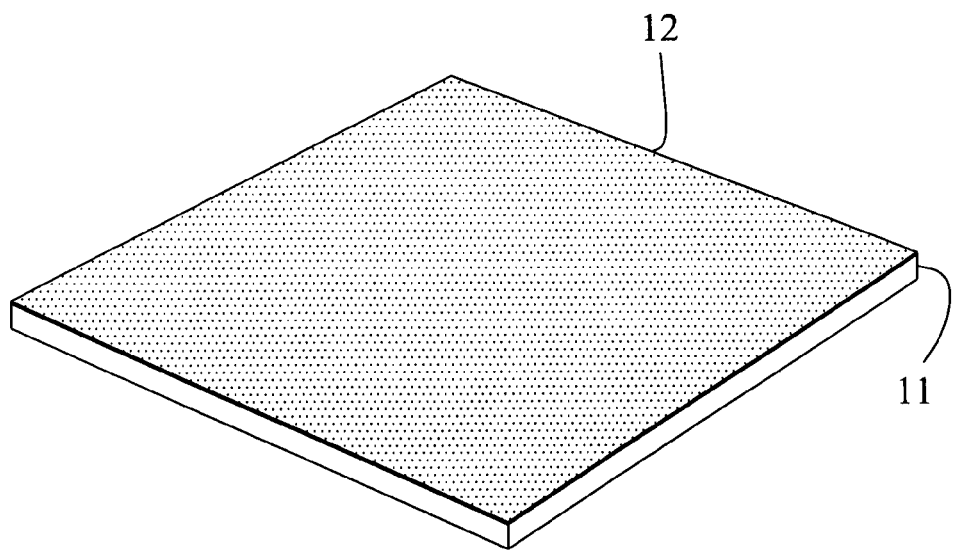
FIG. 1a is a schematic view of a substrate used in a prior electronic device packaging process.
Figure 1B:
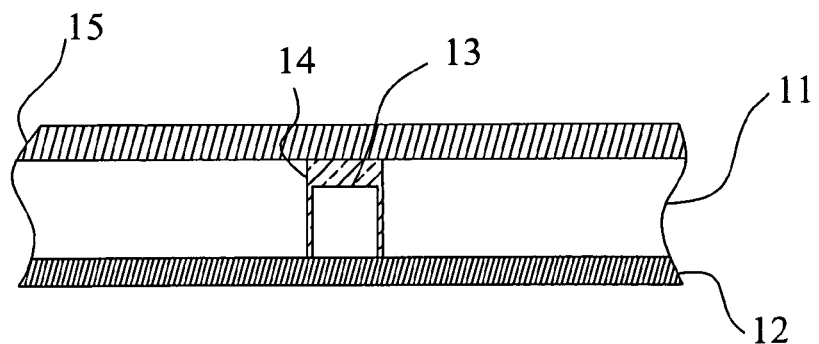
FIG. 1b is a schematic view of an electronic device package formed by a prior electronic device packaging process.
Figure 2:
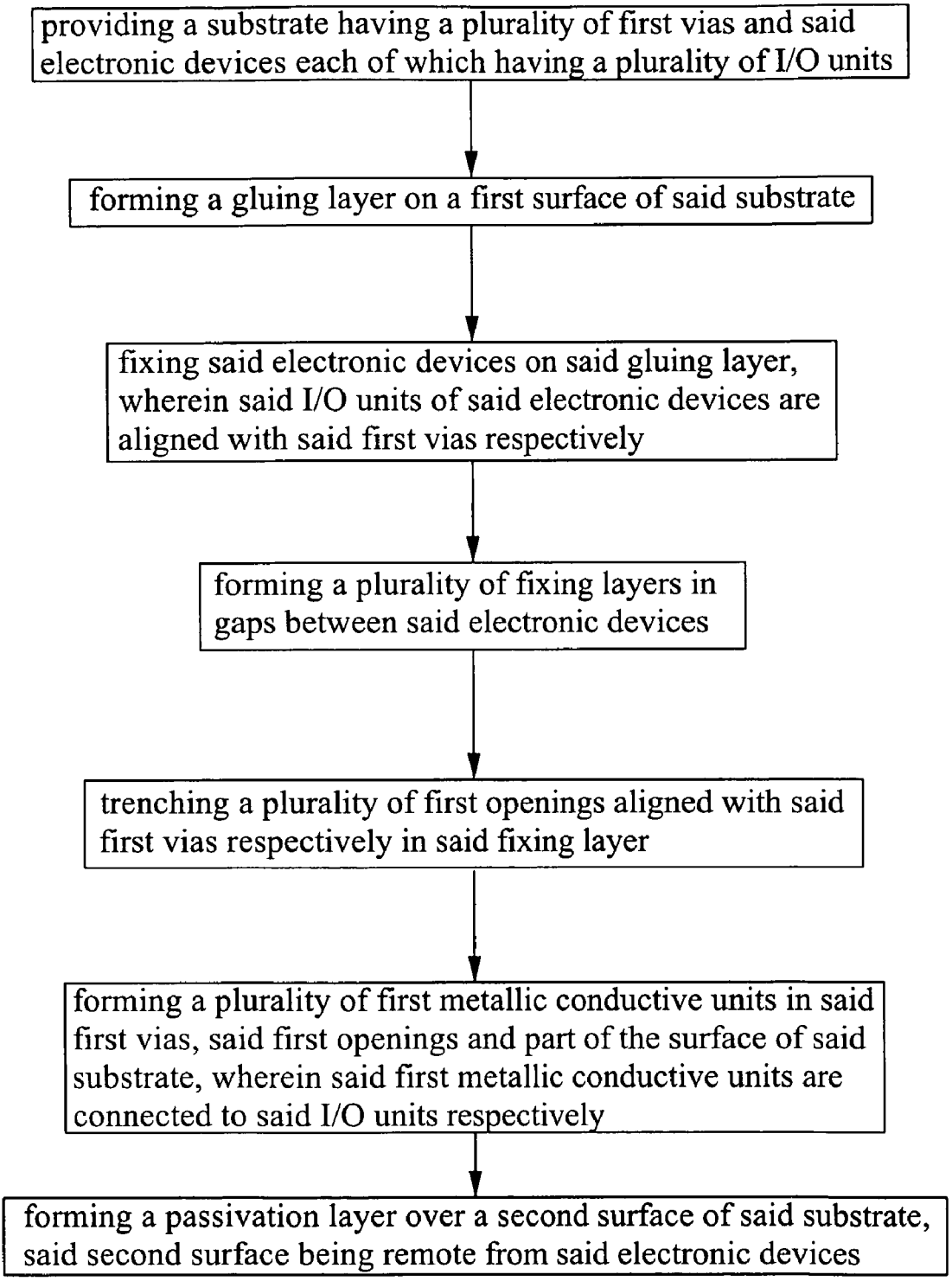
FIG. 2 is a flowchart of a manufacturing method for packaging electronic devices according to the first preferred embodiment of the present invention.

A manufacturing method for packaging electronic devices according to the first preferred embodiment of the present invention is now described step by step with reference to the flowchart (FIG. 2) and the diagrams of the packaging structure in the respective processing steps (FIG. 3 to FIG. 9).

Figure 3:
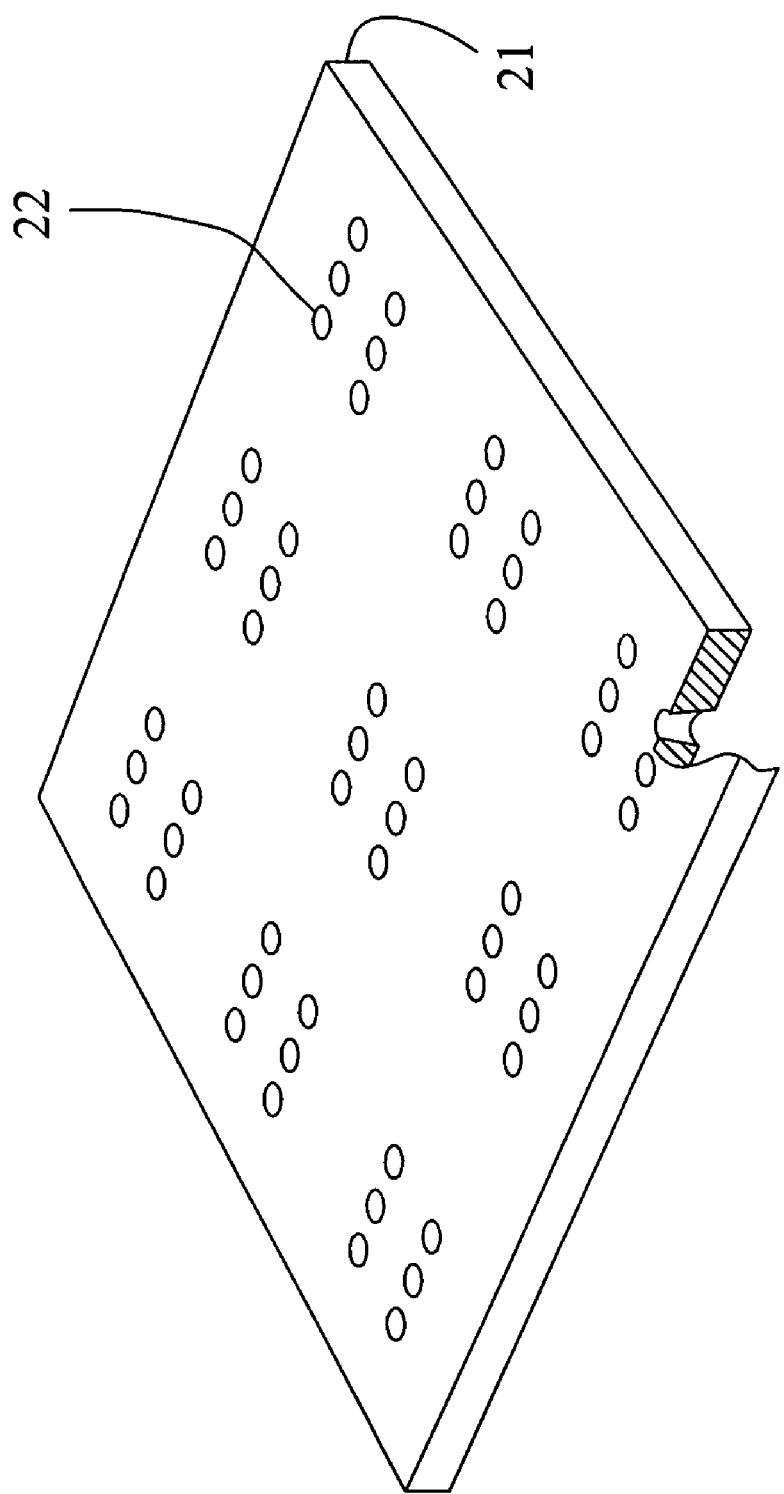
FIG. 3 is a schematic view of a substrate used in a manufacturing method for packaging electronic devices according to the first preferred embodiment of the present invention.
Figure 4:
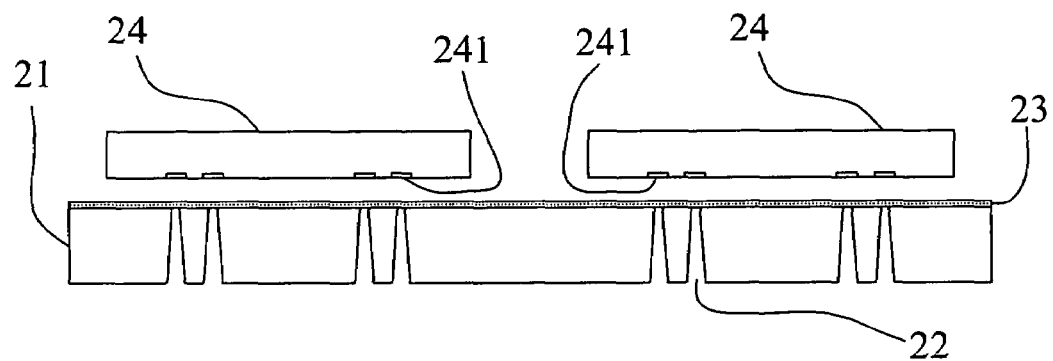
FIG. 4 is a schematic view illustrating the position of dice on a substrate when the dice are attached to the surface of the substrate in a manufacturing method for packaging electronic devices according to the first preferred embodiment of the present invention.
Figure 5:
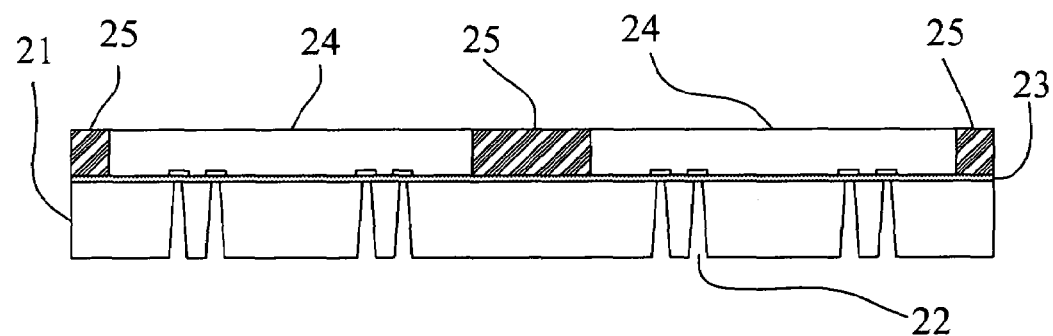
FIG. 5 is a schematic view of an electronic device package having a number of dice held on a substrate surface in a manufacturing method for packaging electronic devices according to a first preferred embodiment of the present invention.

Referring to FIG. 3, a substrate 21 having a plurality of vias 22 formed therein by mechanical drilling or laser drilling is provided, the vias 22 being arranged in accordance with I/O ports of a die to be incorporated. Referring to FIGS. 4 and 5, a gluing layer 23 is formed over the surface of the substrate 21 by spin coating. Two dice 24 each of which having a plurality of I/O ports 241 are mounted on the surface of the gluing layer 23 in an aligned manner by a pressing method. (Although only two dice are shown in the related drawings, it is not intended to limit the scope of the present invention with respect to the quantity of the die, but serving as an example for the descriptions which follow.) The I/O ports 241 of each of the two dice 24 are aligned with the vias 22 of the substrate 21, respectively. After the two dice 24 are fixedly attached to the surface of the gluing layer 23, a plurality of fixing protective layers 25 is formed in the gap between the two dice 24 and the gaps between either of the two dice 24 and any other die (not shown) by a screen printing method. It is noted that the fixing protective layers 25 can also be formed over the surface (not shown) of the two dice 24 by a screen printing method.

Figure 6:
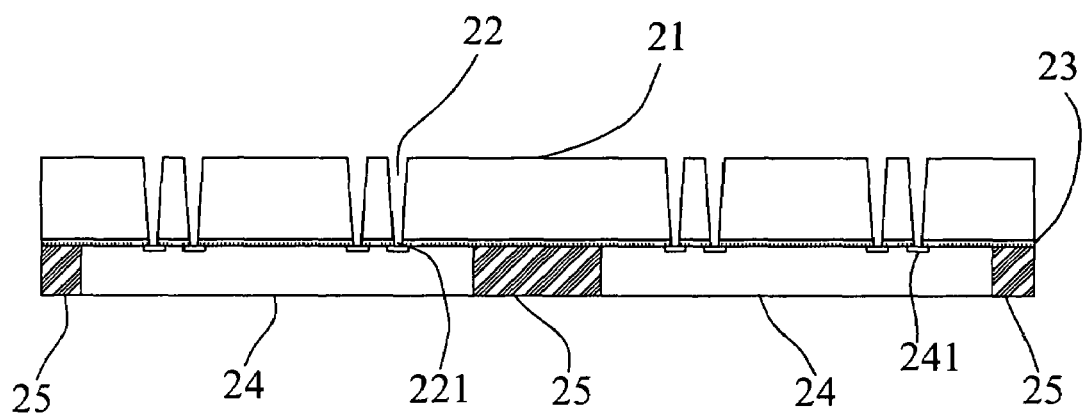
FIG. 6 is a schematic view of an electronic device package having a plurality of openings formed in a gluing layer in a manufacturing method for packaging electronic devices according to the first preferred embodiment of the present invention.
Figure 7:
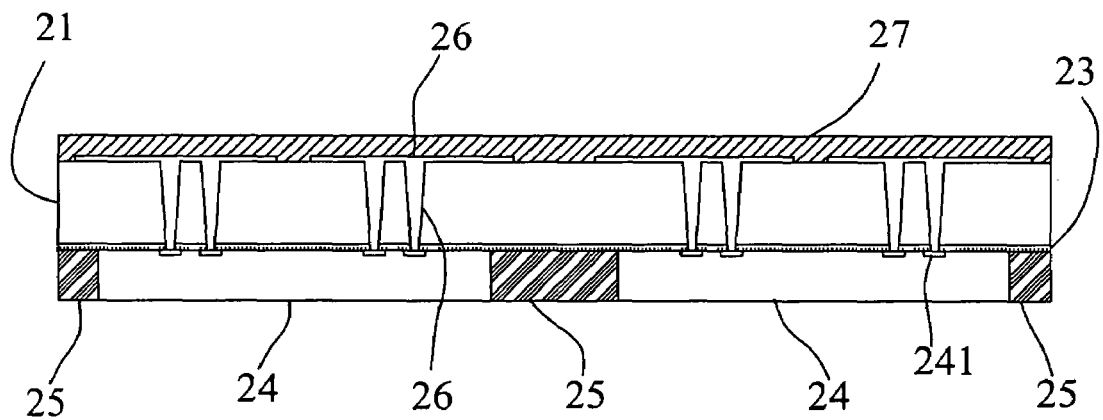
FIG. 7 is a schematic view of an electronic device package having a plurality of metal contacts and a passivation layer formed in a manufacturing method for packaging electronic devices according to the first preferred embodiment of the present invention.
Figure 8:
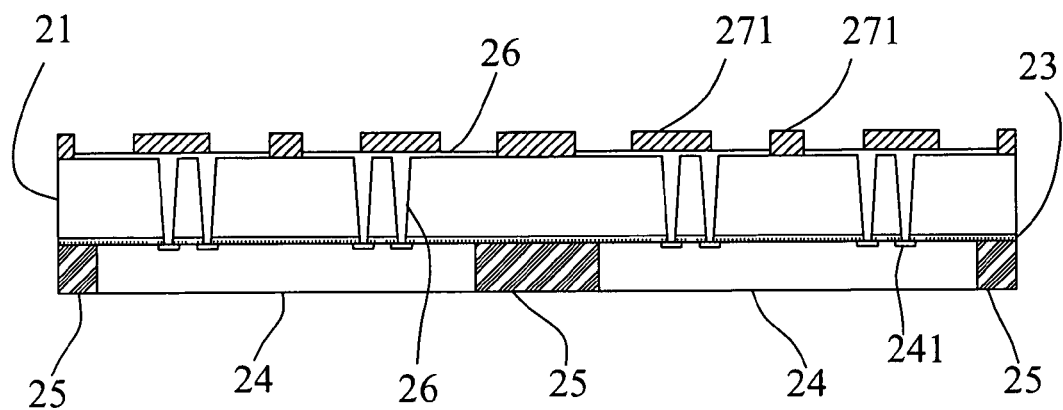
FIG. 8 is a schematic view of an electronic device package having a plurality of projections formed on a surface of a passivation layer in a manufacturing method for packaging electronic devices according to the first preferred embodiment of the present invention.
Figure 9:
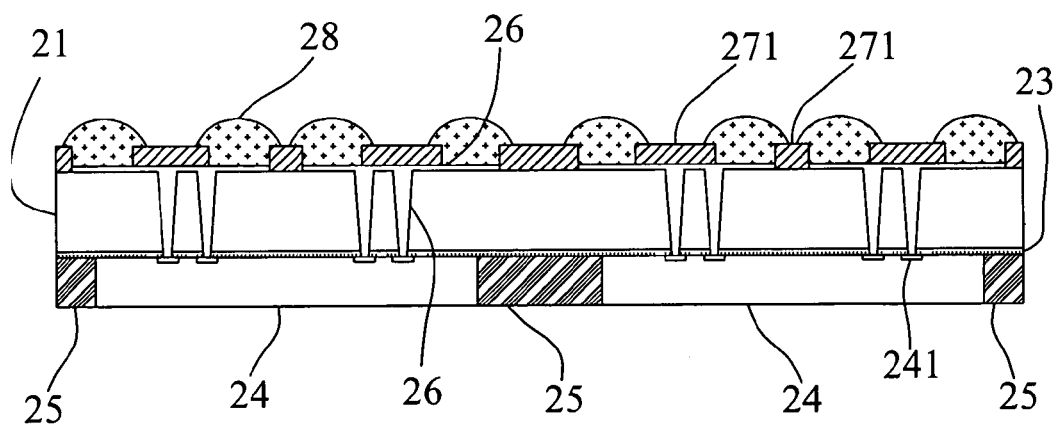
FIG. 9 is a schematic view of an electronic device package having a plurality of solder balls formed between projections in a manufacturing method for packaging electronic devices according to the first preferred embodiment of the present invention.

Referring to FIG. 6, a plurality of openings 221 is formed in the gluing layer 23 by laser drilling, wherein the openings 221 are aligned with the plurality of vias 22 of the substrate 21 respectively. Referring to FIG. 7, a plurality of metal contacts 26 is formed in the aforesaid vias 22, the openings 221 and part of the surface of the substrate 21, being electrical connecting to the I/O ports 241 of the two dice 24. The metal contacts 26 are formed by plating. Then, a water-resisting layer 27 is formed over a surface of the substrate 21 by a sol-gel method, wherein the surface is remote from the two dice 24. The water-resisting layer 27 may cover the metal contacts 26 formed on part of the surface of the substrate 21. After the water-resisting layer 27 is formed, the water-resisting layer 27 is etched to form a desired pattern by employing the widely adopted technique, such as dry etching or wet etching. As such, a plurality of projections 271 is formed as shown in FIG. 8. Referring to FIG. 9, a step of solder ball implantation proceeds, in which a plurality of solder balls 28 is implanted into the gaps between the projections 271. Consequently, an electronic device package is formed by employing a manufacturing method for packaging electronic devices according to the first preferred embodiment of the present invention. It is noted that the dice 24 of different types may have various quantities of I/O ports 241. Thus, the manufacturing method for packaging electronic devices of the present invention may further comprise a step forming a multi-layer wiring structure having a build-up layer over the surface of the substrate 21 to generate at least one isolation layer and corresponding wirings. Hence, the respective I/O ports 241 of each of the dice 24 can be laid out as a whole corresponding to the position of the solder balls to be implanted.

Figure 10:
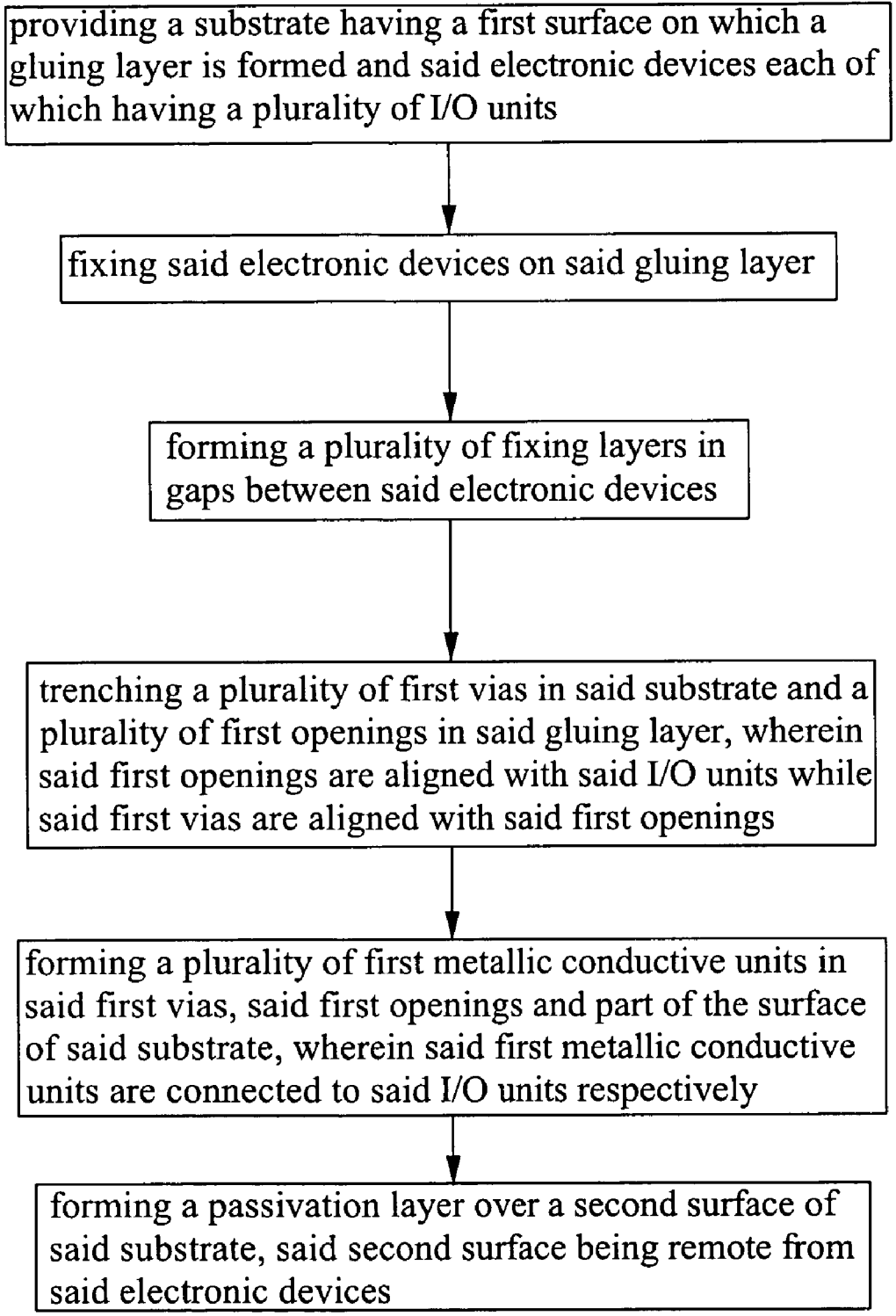
FIG. 10 is a flowchart of a manufacturing method for packaging electronic devices according to the second preferred embodiment of the present invention.

FIG. 10 is the flowchart of a manufacturing method for packaging electronic devices according to the second preferred embodiment of the present invention. Similarly, this preferred embodiment is now described step by step with reference to the flowchart (FIG. 10) and the diagrams of the packaging structure in the respective processing steps (FIG. 11 to FIG. 17).

Figure 11:
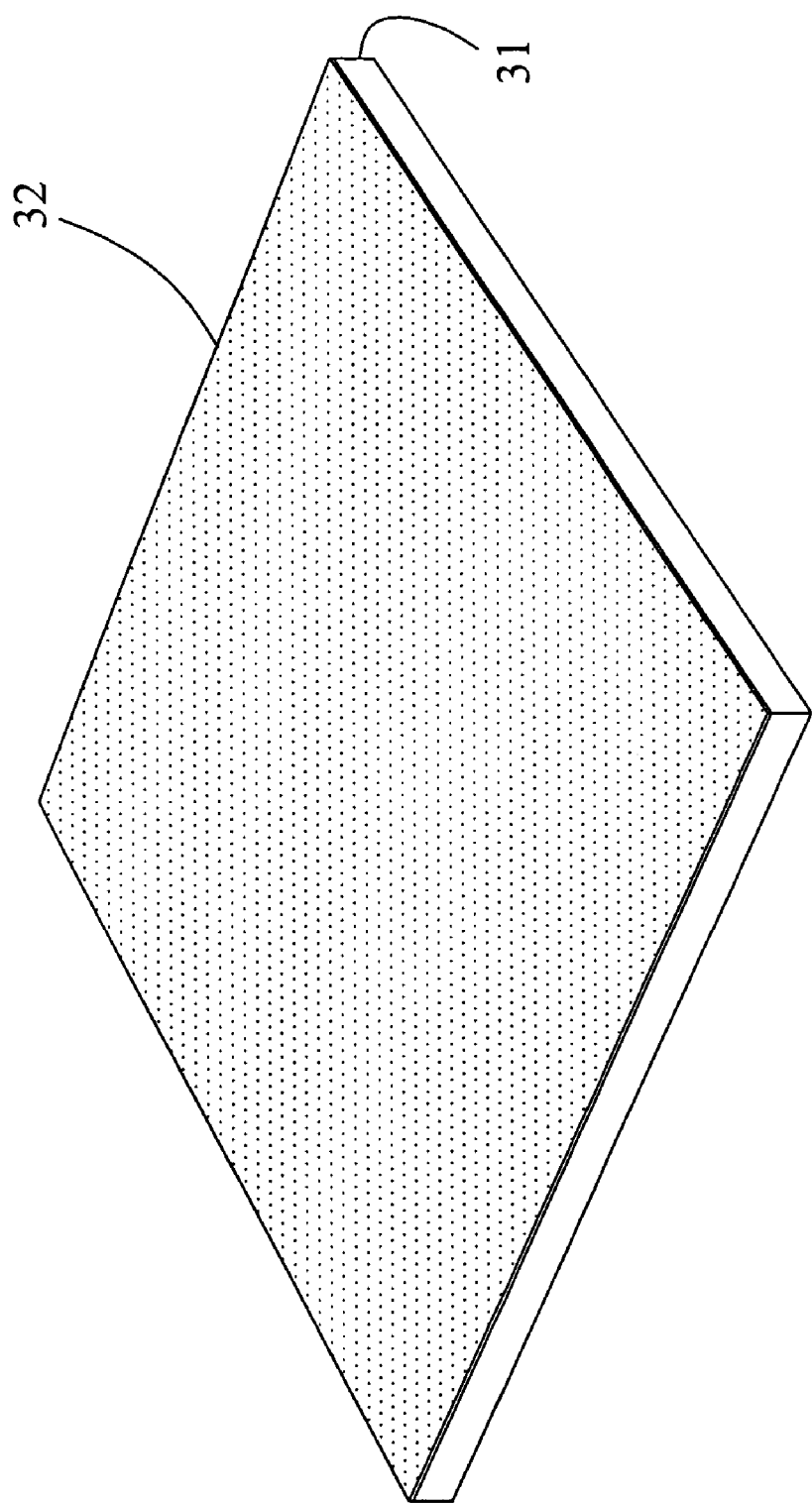
FIG. 11 is a schematic view of a substrate used in a manufacturing method for packaging electronic devices according to the second preferred embodiment of the present invention.
Figure 12:
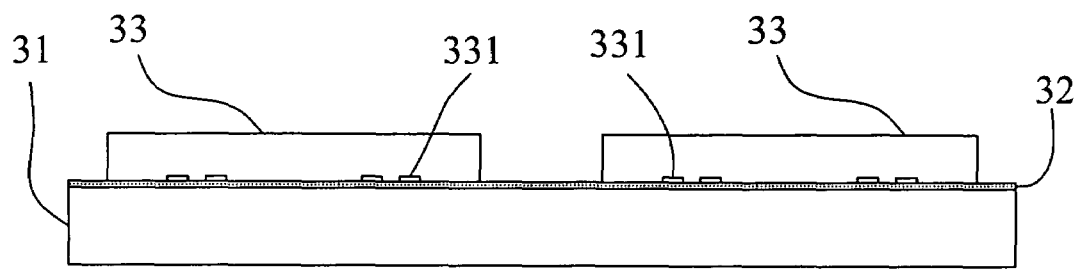
FIG. 12 is a schematic view of an electronic device package having dice mounted on a substrate surface in a manufacturing method for packaging electronic devices according to the second preferred embodiment of the present invention.
Figure 13:
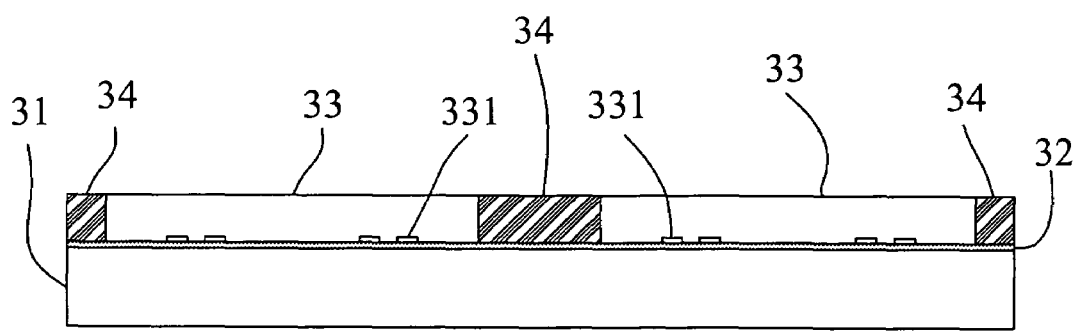
FIG. 13 is a schematic view of an electronic device package having dice mounted on a substrate surface and a plurality of fixing protective layers formed in a manufacturing method for packaging electronic devices according to the second preferred embodiment of the present invention.

Referring to FIG. 11, a substrate 31 having a gluing layer 32 formed over the surface thereof is provided. The gluing layer 32 is formed on the surface of the substrate 31 by an appropriate method such as pressing. Referring to FIGS. 12 and 13, two dice 33 each of which having a plurality of I/O ports 331 are mounted on the surface of the gluing layer 32 by pressing. (Although only two dice are shown in the related drawings, it is not intended to limit the scope of the present invention with respect to the number of the die, but serves as an example for the descriptions which follow.) A plurality of fixing protective layers 34 is formed in the gap between the two dice 33 and the gaps between either of the two dice 33 and any other die (not shown) by a screen printing method. It is noted that the fixing protective layers 34 can also be formed over the surface (not shown) of the two dice 33.

Figure 14:
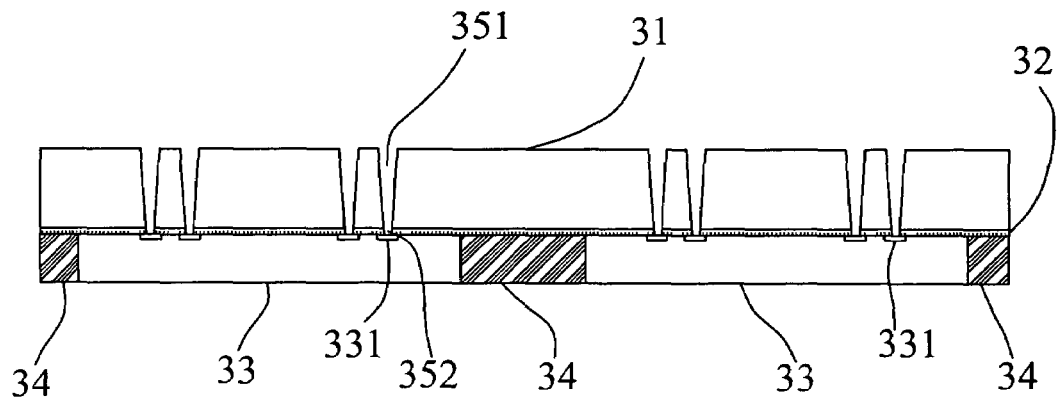
FIG. 14 is a schematic view of an electronic device package having a plurality of openings formed in a gluing layer in a manufacturing method for packaging electronic devices according to the second preferred embodiment of the present invention.
Figure 15:
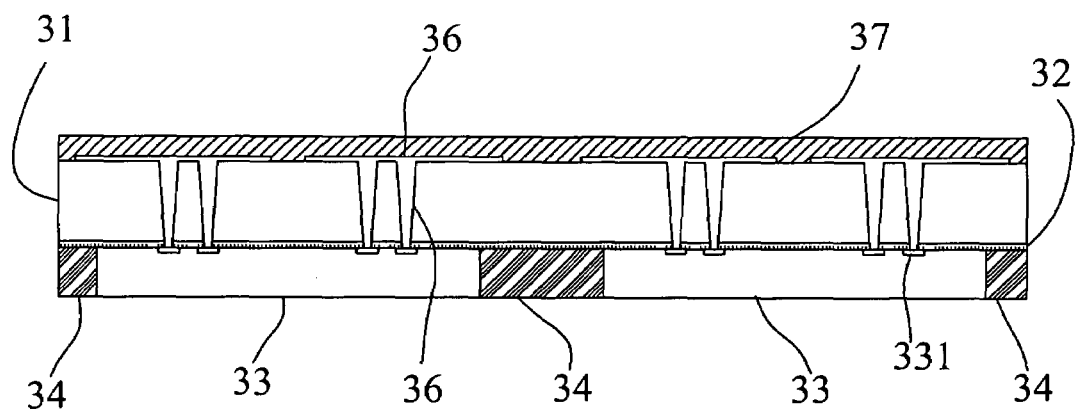
FIG. 15 is a schematic view of an electronic device package having a plurality of metal contacts and a passivation layer formed in a manufacturing method for packaging electronic devices according to the second preferred embodiment of the present invention.
Figure 16:
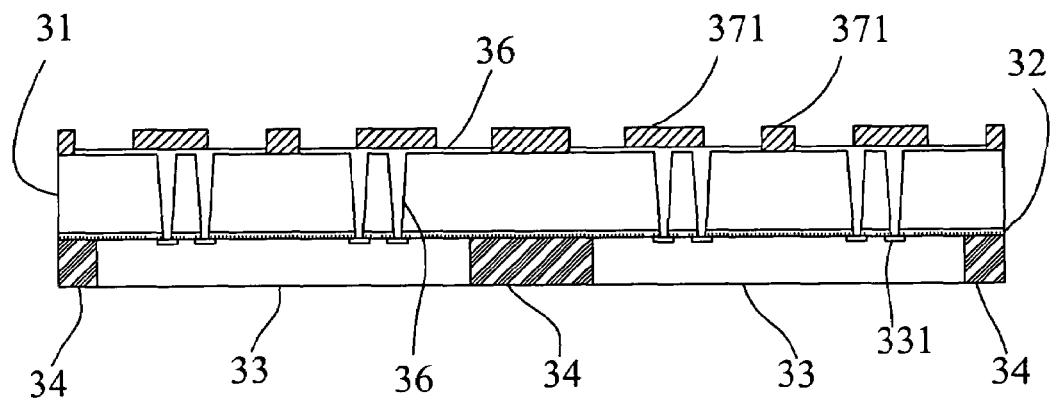
FIG. 16 is a schematic view of an electronic device package having a plurality of projections formed on a surface of a passivation layer in a manufacturing method for packaging electronic devices according to the second preferred embodiment of the present invention.
Figure 17:
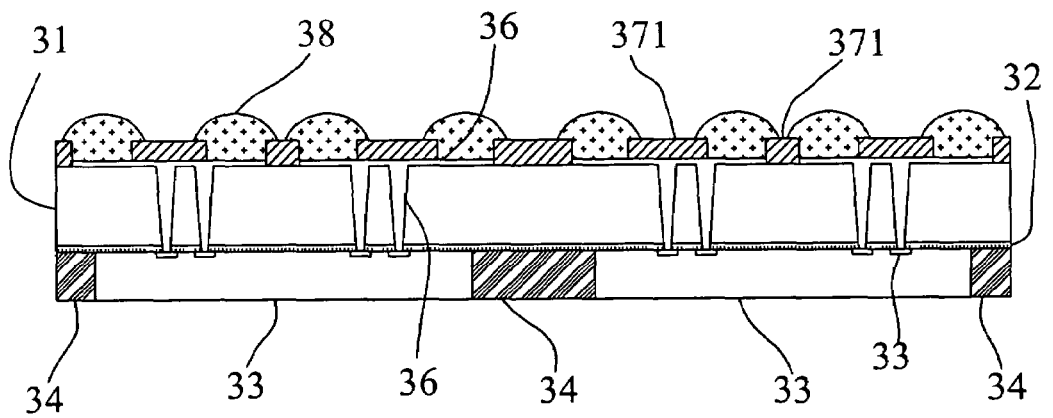
FIG. 17 is a schematic view of an electronic device package having a plurality of solder balls formed between projections in a manufacturing method for packaging electronic devices according to the second preferred embodiment of the present invention.

Referring to FIG. 14, a plurality of vias 351 and a plurality of openings 352 are trenched in the substrate 31 and the gluing layer 32 respectively by laser drilling. The vias 351 and the openings 352 are aligned with the I/O ports 331 of the two dice 33 respectively. Referring to FIG. 15, a plurality of metallic conductive portions 36 is formed in the aforesaid vias 351, the openings 352 and part of the surface of the substrate 31, being electrical connecting to the I/O ports 331 of the two dice 33. Then, a water-resisting layer 37 is formed over a surface of the substrate 33 by a sol-gel method, wherein the surface is remote from the two dice 33. The water-resisting layer 33 may cover the metallic conductive portions 36 formed on part of the surface of the substrate 31. After the water-resisting layer 37 is formed, the water-resisting layer 37 is etched to form a desired pattern by employing the widely adopted technique, such as dry etching or wet etching. As such, a plurality of projections 371 is formed as shown in FIG. 16. Referring to FIG. 17, a step of solder ball implant proceeds, in which a plurality of solder balls 38 is implanted into the gaps between the projections 371. Consequently, an electronic device package is formed by employing a manufacturing method for packaging electronic devices according to the second preferred embodiment of the present invention. It is noted that the dice 33 of different types may have various quantities of I/O ports 331. Thus, the manufacturing method for packaging electronic devices of the present invention may further comprise a step for forming a multi-layer wiring structure having a build-up layer over the surface of the substrate 31 to generate at least one isolation layer and corresponding wirings. Hence, the respective I/O ports 331 of each of the dice 33 can be laid out as a whole corresponding to the position of the solder balls to be implanted.

A manufacturing method for packaging electronic devices according to the third embodiment of the present invention is described below.

Figure 18:
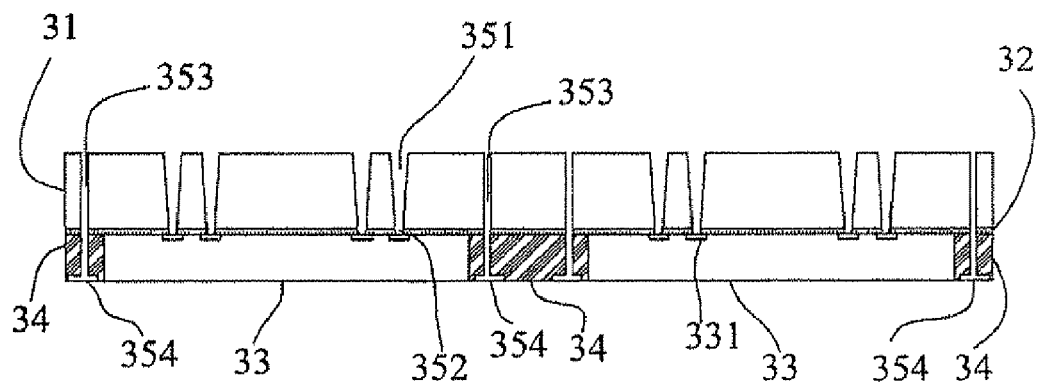
FIG. 18 is a schematic view of an electronic device package having a plurality of vias, a plurality of openings, a plurality of through-holes and a plurality of grooves in a manufacturing method for packaging electronic devices according to the third preferred embodiment of the present invention.
Figure 19:
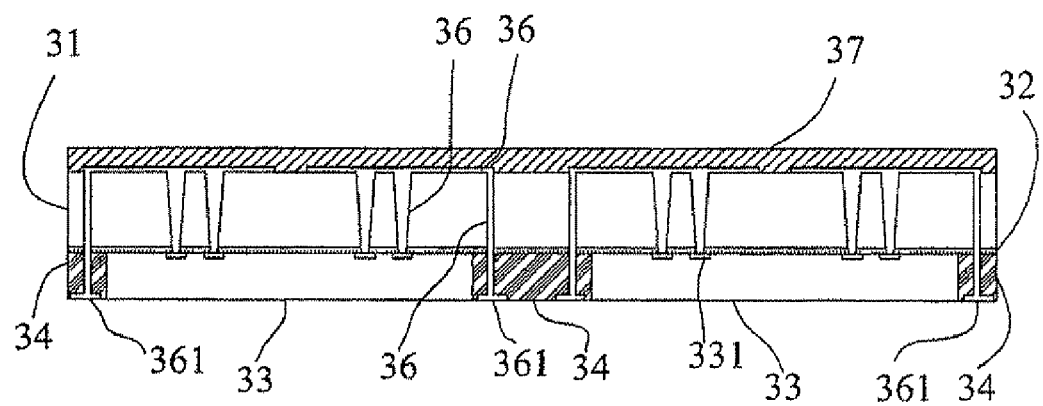
FIG. 19 is a schematic view of an electronic device package having a plurality of metal contacts, a plurality of bottom metal contacts and a passivation layer formed in a manufacturing method for packaging electronic devices according to the third preferred embodiment of the present invention.

Referring to FIGS. 18 through 21, a manufacturing method for packaging electronic devices according to the third embodiment of the present invention includes the formation of a plurality of additional metal contacts such as bottom metal contacts 361 as shown in FIG. 19 at the end close to the aforesaid two dice of an electronic device package.

It is noted that some preceding steps of the manufacturing method for packaging electronic devices according to the third embodiment of the present invention are substantially similar to those of the first or the second embodiment of the present invention, except that a plurality of through-holes 353 is trenched in the fixing protective layers 25 (34), the gluing layer 23 (32) and the substrate 21 (31) in the step of either forming the openings 221 in the gluing layer 23 by of mechanical drilling or laser drilling (as illustrated in FIG. 6 for the first embodiment) or forming the vias 351 and the openings 352 in the substrate 31 and the gluing layer 32 respectively by mechanical drilling or laser drilling (as illustrate in FIG. 14 for the second embodiment). In addition to the through-holes 353, grooves 354 can also be trenched at the bottom of the fixing protective layers 34, as shown in FIG. 18.

Figure 20:
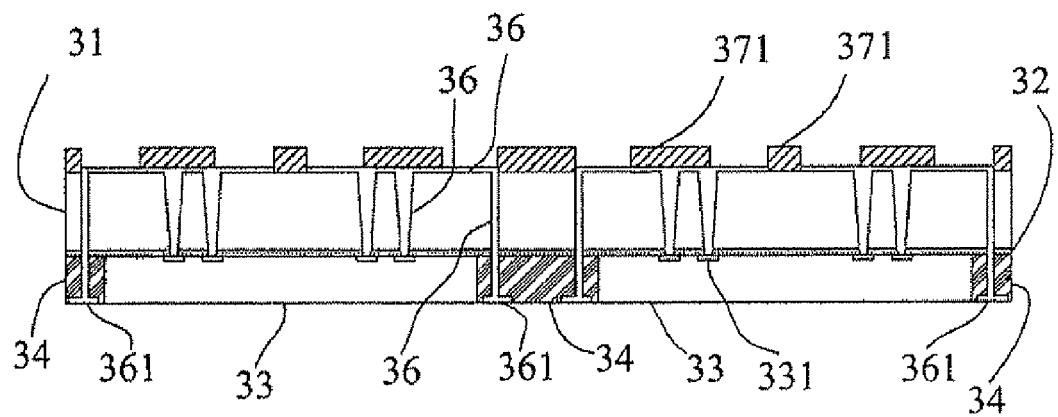
FIG. 20 is a schematic view of an electronic device package having a plurality of projections formed in a manufacturing method for packaging electronic devices according to the third preferred embodiment of the present invention.
Figure 21:
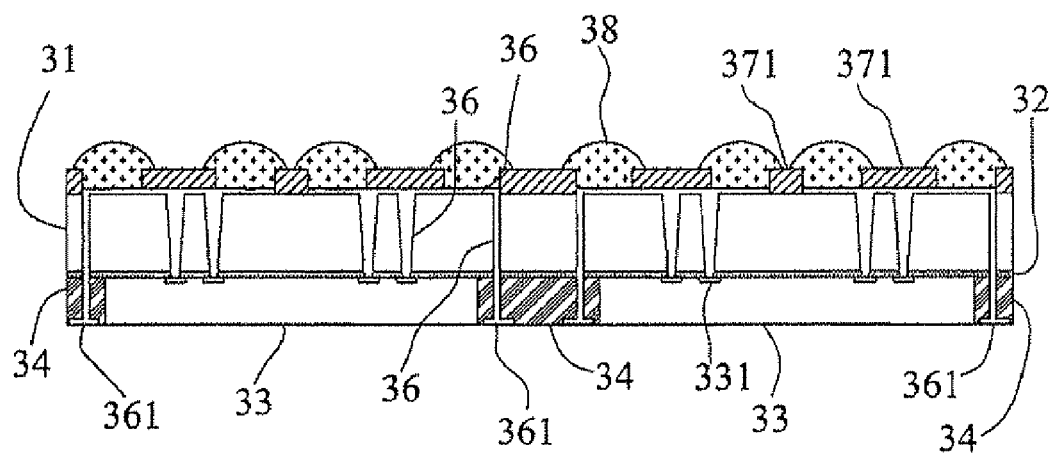
FIG. 21 is a schematic view of an electronic device package having a plurality of solder balls formed between projections in a manufacturing method for packaging electronic devices according to the third preferred embodiment of the present invention.

Referring to FIG. 19, a plurality of metallic conductive portions 36 is formed in the aforesaid vias 351, the openings 352, the through-holes 353 and part of the surface of the substrate 31, being electrical connecting to the I/O ports 331 of the two dice 33. In addition, the bottom metal contacts 361 are formed in the grooves 354. Then, a water-resisting layer 37 is formed over a surface of the substrate 33 by a sol-gel method, wherein the surface is remote from the two dice 33. The water-resisting layer 33 may cover the metallic conductive portions 36 formed on part of the surface of the substrate 31. After the water-resisting layer 37 is formed, the water-resisting layer 37 is then etched to form a desired pattern by employing the widely adopted technique, such as dry etching or wet etching. As such, a plurality of projections 371 is formed as shown in FIG. 20. Referring to FIG. 21, a step of solder ball implant proceeds, in which a plurality of solder balls 38 is implanted into the gaps between the projections 371. It is noted that the dice 33 of different types may have various quantities of I/O ports 331. Thus, the manufacturing method for packaging electronic devices of the present invention may further comprise a step forming a multi-layer wiring structure having a build-up layer over the surface of the substrate 31 to generate at least one isolation layer and corresponding wirings. Hence, the respective I/O ports 331 of each of the dice 33 can be laid out as a whole corresponding to the position of the solder balls to be implanted. Consequently an electronic device package having additional bottom metal contacts 361 is formed by employing a manufacturing method for packaging electronic devices according to the third embodiment of the present invention.

It is noted that a manufacturing method for packaging electronic devices according to the third embodiment of the present invention can be illustrated by referring to the electronic device package formed by employing a manufacturing method for packaging electronic devices according to the first embodiment of the preset invention, though the related descriptions and the reference numbers as illustrated from FIG. 18 to FIG. 21 refer to the electronic device package formed by employing a manufacturing method for packaging electronic devices according to the second embodiment of the present invention.

Although the present invention has been explained in relation to its preferred embodiments, it is to be understood that many other possible modifications and variations can be made without departing from the spirit and scope of the invention as hereinafter claimed.

What is claimed is:

1. An electronic device package associated with a plurality of electronic devices each of which having a plurality of I/O units, comprises:
   a substrate having a plurality of first vias and a plurality of second vias formed in said substrate;
   a gluing layer having a plurality of first openings and a plurality of second openings formed in said gluing layer, wherein said electronic devices are fixed to a first surface of said substrate with said gluing layer, said first vias correspond to said first openings corresponding to the I/O units respectively;
   a plurality of fixing protective layers being disposed on said first surface of said substrate and in gaps between said electronic devices, wherein a plurality of through-holes are formed in said fixing protective layers;
   a plurality of first metallic conductive portions in said first vias, said first openings and part of a second surface of said substrate, respectively, wherein said first metallic conductive portions are connected to said I/O units respectively;
   a passivation layer covering part of a surface of said first metallic conductive portions; and
   a plurality of conducting members formed on part of said surface of said first metallic conductive portions which is not covered with said passivation layer;
   wherein said through-holes are aligned with said second openings.

2. The package of claim 1, wherein said substrate is made from glass fiber, polyimide, copper, or aluminum.

3. The package of claim 1, wherein said package further comprises a plurality of second metallic conductive portions formed in said second vias, said second openings and said through-holes.

4. The package of claim 1, wherein said second openings are aligned with said second vias.

5. The package of claim 1, wherein said first metallic conductive portions are in association with a plurality of isolating members to form a plurality of multi-layer wiring structures.

6. The package of claim 1, wherein said conducting members are solder balls.

7. The package of claim 1, wherein conducting members are a plurality of pin grid arrays.

8. An electronic device package associated with a plurality of electronic devices each of which having a plurality of I/O units, comprises:
   a substrate having a plurality of first vias;
   a gluing layer having a plurality of first openings, wherein said electronic devices are fixed to a first surface of said substrate with said gluing layer, said first vias correspond to said first openings corresponding to the I/O units respectively;
   a plurality of fixing protective layers being disposed on said first surface of said substrate and in gaps between said electronic devices, wherein a plurality of through-holes are formed in said fixing protective layers;
   a plurality of first metallic conductive portions in said first vias, said first openings and part of a second surface of said substrate, respectively, wherein said first metallic conductive portions are connected to said I/O units respectively;
   a passivation layer covering part of a surface of said first metallic conductive portions; and
   a plurality of conducting members formed on part of said surface of said first metallic conductive portions which is not covered with said passivation layer;
   wherein said through-holes are aligned with second openings in the gluing layer.

* * * * *

UNITED STATES PATENT AND TRADEMARK OFFICE
CERTIFICATE OF CORRECTION

PATENT NO.       : 7,632,707 B2                                   Page 1 of 1
APPLICATION NO.  : 11/269613
DATED            : December 15, 2009
INVENTOR(S)      : Chen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1034 days.

Signed and Sealed this

Twenty-first Day of December, 2010

David J. Kappos
*Director of the United States Patent and Trademark Office*